(12) United States Patent
Langhans et al.

(10) Patent No.: US 9,331,600 B2
(45) Date of Patent: May 3, 2016

(54) ELECTRONIC POWER CIRCUIT, ELECTRIC MOTOR, AND PROCEDURE FOR CHECKING THE OPERABILITY OF AN ELECTRONIC POWER CIRCUIT

(71) Applicant: KUKA Roboter GmbH, Augsburg (DE)

(72) Inventors: Michael Langhans, Balzhausen (DE); Sebastian Zehetbauer, Munich (DE)

(73) Assignee: KUKA Roboter GmbH, Augsburg (DE)

( * ) Notice: Subject to any disclaimer, the term of this patent is extended or adjusted under 35 U.S.C. 154(b) by 136 days.

(21) Appl. No.: 14/060,861

(22) Filed: Oct. 23, 2013

(65) Prior Publication Data

US 2014/0112037 A1   Apr. 24, 2014

(30) Foreign Application Priority Data

Oct. 23, 2012 (DE) .......................... 10 2012 219 320

(51) Int. Cl.

| | |
|---|---|
| *H02H 7/122* | (2006.01) |
| *H02M 7/5387* | (2007.01) |
| *H02M 1/32* | (2007.01) |
| *G01R 31/327* | (2006.01) |
| *G01R 31/42* | (2006.01) |
| *H02M 1/092* | (2006.01) |
| *H02M 1/08* | (2006.01) |

(52) U.S. Cl.
CPC .......... *H02M 7/5387* (2013.01); *G01R 31/3277* (2013.01); *G01R 31/42* (2013.01); *H02M 1/32* (2013.01); *H02M 1/08* (2013.01); *H02M 1/092* (2013.01)

(58) Field of Classification Search
CPC ..... G01R 31/3277; G01R 31/42; H02M 1/32; H02M 1/08; H02M 7/5387; H02M 1/084; H02M 1/092; H03K 17/06; H03K 17/08128; H03K 17/168; H03K 17/691; H03K 17/785; H03K 2017/066; H03K 2017/6875
USPC ...................... 363/55, 56.01–56.12, 131–134; 323/282–285, 271–272; 318/800–801
See application file for complete search history.

(56) References Cited

U.S. PATENT DOCUMENTS 5,510,725 A * 4/1996 Schantz et al. ........... 324/762.09
6,573,681 B2 * 6/2003 Schwesig ...................... 318/801

(Continued)

FOREIGN PATENT DOCUMENTS

| | | |
|---|---|---|
| DE | 100 59 173 C1 | 3/2002 |
| DE | 103 07 997 A1 | 9/2004 |

(Continued)

OTHER PUBLICATIONS

German Patent Office; Search report in German Patent Application No. 10 2012 219 320.0 dated Feb. 27, 2013; 5 pages.

*Primary Examiner* — Timothy J Dole
*Assistant Examiner* — Shahzeb K Ahmad
(74) *Attorney, Agent, or Firm* — Wood, Herron & Evans, LLP

(57) ABSTRACT

An electronic power circuit, electrical machine and a method for verifying the functionality of an electronic power circuit. The invention relates to an electronic power circuit, an electrical machine with the electronic power circuit and a method for verifying the functionality of the electronic power circuit. The electronic power circuit comprises a power unit with at least one power semi-conductor switch, which is equipped to generate a pulsed electrical voltage for an electrical consumer from an electrical voltage on the basis of an alternating powering on and off of the at least one power semiconductor switch, and control electronics equipped to control the power semiconductor switch for the alternating powering on and off.

11 Claims, 3 Drawing Sheets

(56) References Cited

U.S. PATENT DOCUMENTS

| | | | |
|---|---|---|---|
| 7,529,111 B2* | 5/2009 | Schierling | 363/98 |
| 2005/0122747 A1* | 6/2005 | Gaksch | 363/24 |
| 2010/0066329 A1* | 3/2010 | Chiu et al. | 323/282 |
| 2010/0288067 A1* | 11/2010 | Hofmann et al. | 74/490.03 |

FOREIGN PATENT DOCUMENTS

| | | |
|---|---|---|
| DE | 103 07 999 A1 | 9/2004 |
| DE | 10 2004 043 877 A1 | 3/2006 |

* cited by examiner

ELECTRONIC POWER CIRCUIT, ELECTRIC MOTOR, AND PROCEDURE FOR CHECKING THE OPERABILITY OF AN ELECTRONIC POWER CIRCUIT

TECHNICAL FIELD

The invention relates to an electronic power circuit, an electrical machine and a method for verifying the functionality of the electronic power circuit.

BACKGROUND

DE 100 59 173 C1 discloses a control interface for a three-phase ac motor via an inverter in secure technology. The power transistors of the inverter are controlled by means of means for inhibiting pulses. In the event of an error the respective power transistors of the inverter are blocked by means of the means for inhibiting pulses, by interrupting respective supply voltages for the control of the power transistors. The functionality of the means for inhibiting impulses is monitored regularly, e.g. after each time the supply voltage is powered on.

SUMMARY

The problem addressed by the invention is that of creating an opportunity to verify the functionality of the control electronics of an electronic power circuit during operation of the electronic power circuit.

The problem addressed by the invention is solved by an electronic power circuit, having
- a power unit with at least one power semi-conductor switch, which is equipped to generate a pulsed electrical voltage for an electrical consumer from an electrical voltage on the basis of an alternating powering on and off of the at least one power semiconductor switch, and
- control electronics equipped to control the power semiconductor switch for the alternating powering on and off and having an optical coupler with an input stage designed as a light emitter and with an output stage designed as a light receiver, a first semiconductor switch connected parallel to the light emitter, and a second semiconductor switch connected in series to the parallel circuit consisting of the first semiconductor switch and the light emitter, wherein the first semiconductor switch is provided to be opened and closed alternately in accordance with a pulse pattern so that in correspondence with the pulse pattern an electrical current flows through the light emitter and as a result the light emitter emits light in correspondence with the pulse pattern, said light which the light receiver receives in order to generate a corresponding control signal for the at least one power semiconductor switch.

A further aspect of the invention relates to an electrical machine exhibiting the inventive electronic power circuit, an electrical consumer which is provided with the pulsed electrical voltage by means of the electronic power circuit, and a control apparatus, which is equipped to open and close the first semiconductor switch in accordance with the pulse pattern by selection.

The inventive electronic power circuit is e.g. a pulsed power supply unit, i.e. a power supply unit that generates a pulsed electrical voltage for an electrical consumer. This is achieved by means of the power semiconductor switch, which is powered on and off alternately. For example, a power transistor can be used as the power semiconductor switch, as is known in principle to a person skilled in the art. The power transistor is for example an FET or a MOSFET. One example of a pulsed power supply unit is an inverter which generates alternating current voltage from direct current voltage. Inverters are in particular provided to generate a three-phase alternating current voltage from the direct current voltage and have a plurality of power semiconductor switches which e.g. are alternately opened and closed by means of pulse width modulation in order for example to propel a three-phase ac motor as an electrical consumer.

The inventive electrical machine is for example a robot, in particular an industrial robot. Robots comprise as a rule a robotic arm and a control apparatus. The robotic arm has several elements arranged in sequence and connected via hinges and electrical motors for movement of the elements relative to one another. The electrical motors are as a rule driven by means of inverters as power units. Such an inventive robot comprises thus at least one inverter whose power semiconductor switch is driven by means of one or more control electronics in accordance with the inventive electronic power circuit. The control apparatus, on which preferably also a control program runs for movement of the individual elements of the robotic arm, is equipped to trigger the control electronics or their first semiconductor switches.

In order to open and close the at least one power semiconductor switch, the inventive electronic power circuit has the control electronics, which controls the at least one power semiconductor switch in accordance with the pulse pattern. In particular for a galvanic separation the control electronics comprises the optical coupler, which in turn has the light emitter as the input stage and the light receiver as the output stage. The light emitter comprises e.g. a light emitting diode and is equipped to generate light when an electrical current flows through the light emitter or an electrical voltage is applied to the light emitter. The light emitter and the light receiver are optically coupled such that the light receiver receives the light generated by the light emitter and thereupon generates a corresponding electrical signal, e.g. in the form of an electrical current or an electrical voltage. This electronic signal is the control signal for the power semiconductor switch. The light receiver comprises e.g. a photodiode with a driver stage downstream, but can also for example comprise a phototransistor, a photothyristor, a phototriac, a photo Schmitt trigger or a photo darlington transistor.

The first semiconductor switch is switched parallel to the optical coupler or to its light emitter. The first semiconductor switch is for example designed as a first transistor. The first transistor is preferably a first bipolar transistor. If electrical supply voltage is applied to this parallel circuit, the flow of the electrical current can be controlled by the light emitter of the optical coupler by powering the first semiconductor switch on and off, to be precise, by having the electrical current flow through the light emitter in the case of the opened first semiconductor switch, said light emitter then generating light and hence closing the output stage of the optical coupler or the power semiconductor switch. If the first semiconductor switch is, on the other hand, closed, then the input of the optical coupler or the light emitter is briefly closed and does not generate any light. As a result the optical coupler or the control electronics for example actuates the power semiconductor switch such that it is opened.

The control electronics of the inventive electronic power circuit further comprises the second semiconductor switch. This is for example designed as a second transistor, preferably as a second bipolar transistor, and is connected in series to the parallel circuit from the optical coupler or its light emitter and the first semiconductor switch.

The second semiconductor switch is in particular provided for the purpose of disconnecting the power unit. In normal operation provision is in particular made to leave the second semiconductor switch closed and to open the second semiconductor switch for the purpose of rapid disconnection. In the case of a closed second semiconductor switch, that is in normal operation, therefore an electrical current flows through the second semiconductor switch irrespective of the switching state of the first semiconductor switch. In the case of an opened second semiconductor switch, irrespective of the switching state of the first semiconductor switch no electrical current flows through the light emitter of the optical coupler, as a result of which the control electronics triggers the power semiconductor switch such that said power semiconductor switch is opened.

As a result it is possible, as provided in accordance with one embodiment of the inventive electronic power circuit, that said inventive electronic power circuit is equipped to alternately open and close the first semiconductor switch during operation in accordance with the pulse pattern and to leave the second semiconductor switch closed, and to alternately open and close the first semiconductor switch in accordance with the pulse pattern during test operation and to open and again close the second semiconductor switch at a time in which at least one power semiconductor switch is opened, before the power semiconductor is supposed to close again. As a result, according to one variation of the inventive electrical machine it is also possible to have its control apparatus equipped to alternately open and close the first semiconductor switch in accordance with the pulse pattern and leave the second semiconductor switch closed during normal operation, and during test operation to alternately open and close the first semiconductor switch in accordance with the pulse pattern and to open and close the second semiconductor switch again at a time when the at least one power semiconductor switch is opened before the power semiconductor switch is supposed to close again. As a result it is possible to check the functionality of the second semiconductor switch also during normal operation or open the electrical machine for testing purposes without disturbing normal operation or significantly impairing normal operation.

Thus, another aspect of the invention relates to a method for testing the inventive electronic power circuit or the electronic power circuit of the inventive machine, having the following procedural steps:
  alternate opening and closing of the first semiconductor switch in accordance with the pulse pattern and
  opening the second semiconductor switch at a time when the at least one power semiconductor switch is opened, and again closing the second semiconductor switch before the power semiconductor switch is supposed to close again.

In order to verify the functionality of the second semiconductor switch, provision can be made to evaluate the electrical signal applied at the second semiconductor switch during test operation in order to verify that the second semiconductor switch opens reliably. The electrical signal is for example the electrical voltage applied to the second semiconductor switch or the electrical current flowing through the second semiconductor switch. If the electrical current is used as an electrical signal, then e.g. a defective second semiconductor switch is indicated when the amount of electrical current flowing through the second semiconductor switch exceeds a predefined minimum value, although the second semiconductor switch is supposed to be opened. Otherwise the second semiconductor switch is in order.

Provision can also be made that the second semiconductor switch is used to convert a blocking or a release of the inverter or of the power unit to other purposes. For example, provision can be made that the signal is provided for triggering the first semiconductor switch by a programmable chip which requires a certain amount of time for initialization and during this time cannot yet provide any defined control signals for the first semiconductor switch. The control apparatus of the inventive electrical machine can be equipped to leave the second semiconductor switch open during an initialization of the electronic power circuit.

BRIEF DESCRIPTION OF THE DRAWINGS

An exemplary embodiment of the invention is presented as an example in the accompanying schematic drawings. The drawings show the following.

DETAILED DESCRIPTION

Figure 1:
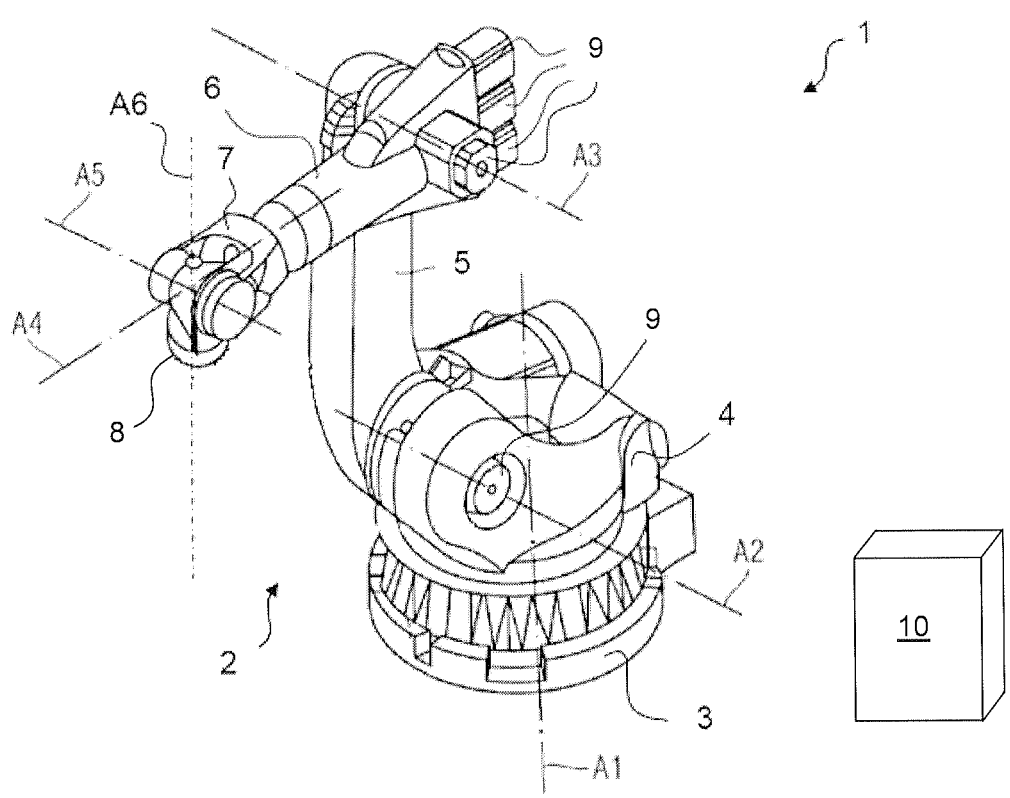
FIG. 1 shows a robot with a robotic arm.

FIG. 1 shows a robot 1 with a robotic arm 2 in a perspective view.

In the case of the present exemplary embodiment the robotic arm 2 comprises several elements arranged in sequence and connected by means of hinges. The elements are in particular a stationary or movable frame 3 and a carousel 4 pivoted around an axis A1 and running perpendicular to the frame 3. Additional elements of the robotic arm 2 are in the case of the present exemplary embodiment an arm 5, an extension arm 6 and a preferably multiple axis robotic hand 7 with a fastening device e.g. designed as a flange 8 for fastening an end effector not shown in greater detail. The arm 5 is pivoted on the lower end e.g. on an arm bearing head on the carousel 4 not shown in greater detail. At the upper end of the arm 5 the extension arm 6 is pivoted on a preferably horizontal axis A4. Said extension arm bears the robotic hand 7 on the end side with its preferably three axes A4, A5, A6.

In order to move the robot 1 or its robotic arm 2, said robot comprises electrical drives 21 connected in generally known manner to a control apparatus 10. A schematic circuit diagram of one of these electrical drives 21 is partially shown in FIG. 2. In FIG. 1 only some of the electrical motors 9 of these electrical drives 21 are shown, said electrical motors being fastened in or on the robotic arm 2. Power electronics of the electrical drives 21 are e.g. arranged within a housing of a control cabinet not shown in greater detail, within which e.g. the control apparatus 10 is also arranged. In the case of the present exemplary embodiment the electrical motors 9 are three-phase ac motors, for example three-phase ac synchronous motors. The power electronics of the electrical drives can also be arranged in and/or on the robotic arm 2.

In the case of the present exemplary embodiment the power electronics comprises, as is known in principle to a person skilled in the art, a rectifier not described in greater detail, which generates a direct current voltage from the supply voltage, an intermediate circuit downstream from the rectifier, likewise not described in greater detail, for smoothing of the direct current voltage and a plurality of converters or inverters 22 downstream from the intermediate circuit capacitor. The smoothed direct current voltage is the supply voltage of the inverters 22 and is in contact with e.g. the node 40. The inverters 22 are each upstream of one of the electrical motors, so that the inverters 22 supply their motors 9 with suitable electrical three-phase voltages, as is known in principle to a person skilled in the art.

A computing program runs on the control apparatus 10, which e.g. is designed as a computer, said program by means of which the control apparatus 10 in the operation of the robot 1 actuates said robot for example such that the flange 8 or a so-called tool center point executes a predetermined movement. If necessary the control apparatus 10 regulates the electrical drives 21, as is known in principle to a person skilled in the art. If necessary the electrical drives 21 are regulated electrical drives and the control apparatus 10 generates desired signals for the regulated drives or their inverters 22.

In the case of the present exemplary embodiment the inverters 22 comprise for example six power semiconductor switches, which are e.g. designed as power transistors 23. The power transistors 23 are in particular designed in FET technology, but can also be other transistors or power semiconductor switches. The inverters 22 comprise in particular three half bridges.

In the operation of the robot 1 the inverters 22 or their power transistors 23 are driven such that they generate a three-phase voltage corresponding to the respective application, with which the corresponding electric motor 9 is supplied. To this end, the inverters 22 or their power transistors 23, in particular the gates of the power transistors 23 are actuated by means of a control circuit 24 using pulse width modulation known in principle to a person skilled in the art. The inverter 22 including the control circuit 24 is thus essentially an electronic power circuit, in particular a pulsed power supply unit.

Figure 2:
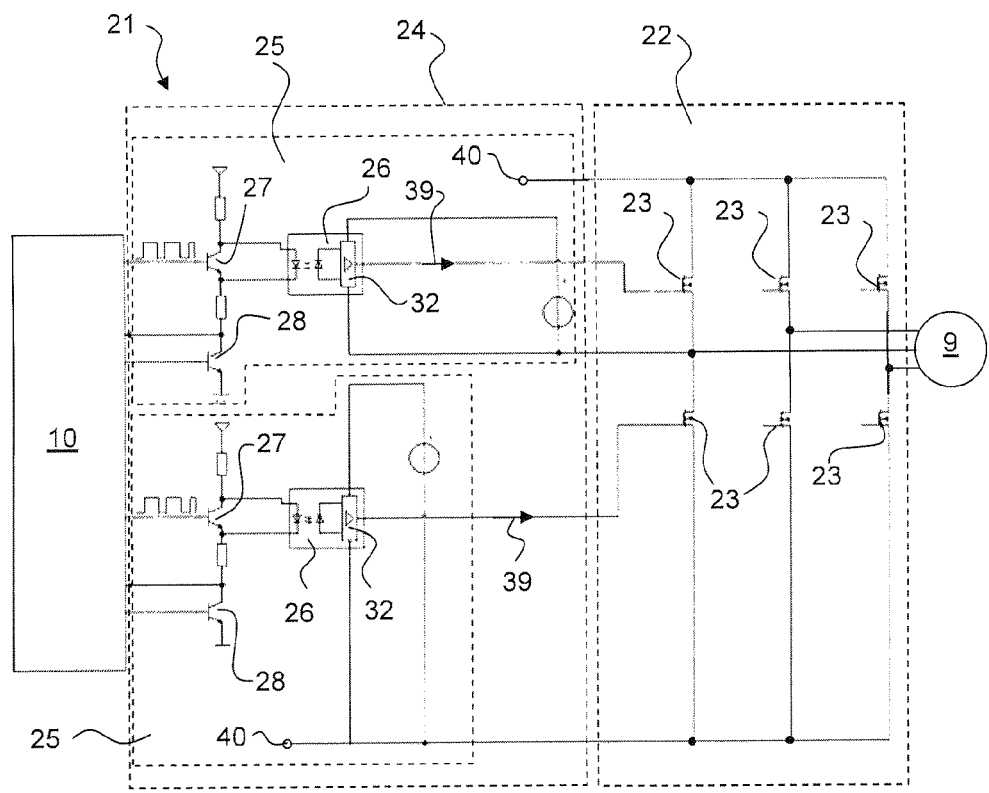
FIG. 2 shows a schematic circuit diagram of an electrical drive for moving one of the elements of the robotic arm and
  FIG. 3 shows a schematic circuit diagram of control electronics of the electrical drive.
Figure 3:
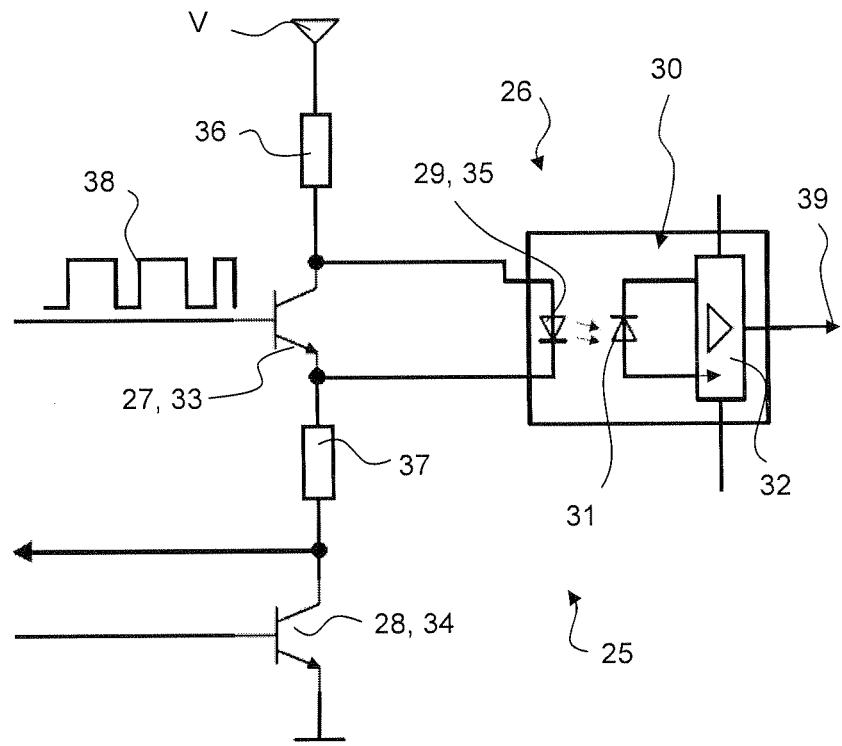

In the case of the present exemplary embodiment the control circuit 24 comprises several control electronics 25, each of which is assigned to one of the power transistors 23. The respective control electronics 25 are provided to actuate the power transistors 23 assigned to them. In FIG. 2, for clarity's sake only two of the control electronics 2 are shown, each being assigned to one of the half bridges of the represented inverter 22. One of the control electronics 25 is shown in greater detail in FIG. 3. In the case of the present exemplary embodiment each of the control electronics 25 comprises an optical coupler 26 and a first semiconductor switch 27 and a second semiconductor switch 28. The two semiconductor switches 27, 28 are in particular designed as a first transistor 33 and a second transistor 34. The two transistors 33, 34 are for example bipolar transistors.

In the case of the present exemplary embodiment the optical coupler 26 comprises an input stage designed as a light emitter 29, said light emitter emitting light, when an electrical voltage is applied at the input of the optical coupler 26. The light emitter 26 is in particular designed as a light emitting diode 35. The optical coupler 26 comprises a light receiver 30 as an output stage, said light receiver converting the light emitted from the light emitter 29 or the photodiode 35 into an electrical signal, said signal serving as the control signal 39 for the power transistor 23 assigned to the corresponding control electronics 25. In the case of the present exemplary embodiment the output stage or the light receiver 30 exhibits a photodiode 31 coupled to the light emitter 29 or the light emitting diode 35 and a driver stage 32 downstream from the photodiode 31. The output of the driver stage 32 is connected to the gate of the corresponding power transistor 23. The light receiver 30 can however e.g. also comprise a phototransistor, a photothyristor, a phototriac, a photo Schmitt trigger or a photo darlington transistor.

In the case of the present exemplary embodiment the first semiconductor transistor 27 or the first transistor 33 of the control electronics 25 is switched parallel to the input stage or to the light emitter 29 such that in the event of a closed first semiconductor switch 27 the input of the optical coupler 26 or of its light emitter 29 is electrically short-circuited. If the first semiconductor 27 is a bipolar first transistor 33, then in particular the collector and the emitter of the first transistor 33 are connected to the light emitter 29 or to the light emitting diode 35 of the optical coupler 26 and the first transistor 33 is powered on or off by actuating its base.

In the case of the present exemplary embodiment the second semiconductor transistor 28 or the second transistor 34 of the control electronics 25 is connected in series to the parallel circuit from the optical coupler 26 and the first semiconductor switch 27.

In the operation of the robot an electrical voltage or supply voltage V is applied to the control electronics 25, in particular at the series circuit, exhibiting the second semiconductor 28 and the parallel circuits from the optical coupler 26 and the first semiconductor switch 27.

In normal operation the second semiconductor switches 28 are closed or the second transistors 34 are conducting and the first semiconductor switches 27 are opened and closed by means of pulse width modulation so that the power transistors 23 are actuated corresponding to the selected pulse width modulation.

The optical couplers 26 actuate the power transistors 23 via the pulse patterns 38 of the pulse width modulation in contact at the bases of the first transistors 33. In the case of the present exemplary embodiment the pulse patterns 38 at the bases of the first transistors 27 represent the inverted pulse pattern for the output stages 30 of the optical couplers (output signal 39 of the optical coupler 26), since in the event of opened first semiconductor switches 27 the electrical voltage is in contact at the light emitter 29 of the corresponding optical coupler 26 and hence the optical couplers 26 power on the power transistors 23 in the event of opened first semiconductors 27. On the other hand, if the corresponding first semiconductor switch 27 is closed, then the light emitter 29 of the corresponding optical coupler 26 is short circuited and as a result deactivates the respective power transistor. The structure of the control electronics 25 in this form has as its consequence that in the event of closed second semiconductor switches 28 an electrical current constantly flows through the second semiconductor switches 28, irrespective of the pulse width modulation, that is, the switching state of the first semiconductor switch 27.

In the case of the present exemplary embodiment provision is made that the inverter 22 is to be automatically powered down for example in an emergency situation by opening the second semiconductor switches 28. Then no electrical voltages are applied to the optical couplers 26 and the power transistors 23 are switched to their non-conducting states (Off state).

In the case of the present exemplary embodiment provision is made to test the second semiconductor switches 28 or the second transistors 34 during normal operation. This test can preferably be performed cyclically.

This test is performed in the following manner:

During normal operation the corresponding second semiconductor switch 28 is opened within the time in which the corresponding power transistor 23 is blocked due to the pulse pattern 38. Thus it is ensured that the test does not impair the appropriate operation of the inverter 22 during normal operation.

In order to check the corresponding second semiconductor switch 28, at least during the test the electrical signal applied to the corresponding second semiconductor switch 28 is verified or evaluated. This electrical signal is for example the electrical voltage applied on the corresponding semiconductor switch 28, in the case of the second transistor 34 as the second semiconductor switch 28 the electrical voltage between its collector and its emitter. If for example the amount of this electrical voltage exceeds a predefined value or corresponds at least to roughly the supply voltage applied on the control electronics 25, the corresponding second semiconductor switch 28 reliably opens or closes the corresponding second transistor 34. Hence it can be assumed that the tested second semiconductor switch 28 is in order. On the other hand, if the amount on the tested second semiconductor switch 28 is relatively small, in particular at least roughly zero, the tested second semiconductor switch 28 does not open or does not close the corresponding second transistor 34. Thus it can be inferred that the tested second semiconductor switch 28 is defective. The test is performed in particular automatically by the control apparatus 10, which e.g. by means of a corresponding computing program actuates the second semiconductor switch 28 and evaluates the corresponding electrical signals.

If a defective second semiconductor switch 28 is detected, e.g. the control apparatus 10 can generate a corresponding warning signal.

The electrical current which flows through the tested second semiconductor switch 28 can also be used as an electrical signal for checking the second semiconductor switch 28. On the basis of the parallel circuit from the optical coupler 26 and the first semiconductor 27 an electrical current always flows through the second semiconductor switch 28 irrespective of the switching state of the first semiconductor switch 27, as long as said second semiconductor switch is closed. Consequently, an appreciable electrical current also flows during the test of the second semiconductor switch 27, should the tested second semiconductor switch 28 be defective and not open. Thus, on the basis of an automatic evaluation of this electrical current in particular by means of the control apparatus 10 a defective second semiconductor switch 28 can be inferred by e.g. evaluating the amount of this electrical current and a defective second semiconductor switch 28 can be inferred if during the test the amount of electrical current is greater than a predefined minimum value.

In the case of the present exemplary embodiment provision is made that the test of the second semiconductor switch 28 takes the least possible amount of time. As a result, e.g. the adjusting range of the ratio of the pulse width modulation for the inverter 22 is subject to only slight restrictions or no restrictions at all. Through a suitable selection of collector and emitter resistances 36, 37 for the first transistors 27 and a suitable operating point adjustment the switching operations of the first and second transistors 33, 34 can be accelerated. This is possible because the circuit topology in the branches of the first and second transistors 33, 34 corresponds in principle to a cascode circuit. The electrical voltage on the basis of the first transistor 33 during a logical "1" in the course of the signal of the pulse width modulation for the first transistors 33 corresponds in the process to the basic direct current voltage of a conventional cascode circuit.

In the case of the present exemplary embodiment provision can also be made that the second semiconductor switches 28 are also used to convert a blocking or release of the inverter 22 to other purposes. For example, provision can be made that the signal for pulse width modulation of the inverter 22 is provided by a programmable chip which requires a certain time for initialization and during this time cannot provide any definable control signals for the first semiconductor switches 27. A risk of a malfunction of the inverter 22 can be at least reduced when the second semiconductor switches 28 are kept in off state or opened during this time.

What is claimed is:

1. An electronic power circuit comprising:
   a power unit with at least one power semiconductor switch, which is equipped to generate a pulsed electrical voltage for an electrical consumer from an electrical voltage on the basis of an alternating powering on and off of the at least one power semiconductor switch, and
   control electronics equipped to control the power semiconductor switch for the alternating powering on and off and having an optical coupler with an input stage designed as a light emitter and with an output stage designed as a light receiver, a first semiconductor switch connected parallel to the light emitter, and a second semiconductor switch connected in series to the parallel circuit consisting of comprising the first semiconductor switch and the light emitter,
   wherein the first semiconductor switch is provided to be opened and closed alternately in accordance with a pulse pattern so that in correspondence with the pulse pattern an electrical current flows through the light emitter and as a result the light emitter emits light in correspondence with the pulse pattern, said light which the light receiver receives being used to generate a corresponding control signal for the at least one power semiconductor switch, and
   wherein the electric current flows through the light emitter while the first semiconductor switch is open, and
   wherein the second semiconductor switch is closed during normal operation and is opened for opening the at least one power semiconductor switch irrespective of the switching state of the first semiconductor switch.

2. The electronic power circuit according to claim 1, in which the power unit is designed as an inverter, and/or in which the pulse pattern is based on a pulse width modulation, and/or the first semiconductor switch is designed as a first transistor and/or the second semiconductor switch is designed as a second transistor.

3. The electronic power circuit of claim 2, wherein the power unit is an inverter for generating three-phase alternating current voltage.

4. The electronic power circuit according to claim 1, which is equipped to alternately open and close the first semiconductor switch during operation in accordance with the pulse pattern and to leave the second semiconductor switch closed, and to alternately open and close the first semiconductor switch in accordance with the pulse pattern during test operation and to open and again close the second semiconductor switch at a time in which at least one power semiconductor switch is opened, before the power semiconductor is supposed to close again.

5. The electronic power circuit according to claim 4, which is equipped to evaluate the electrical signal applied at the second semiconductor switch during test operation in order to verify that the second semiconductor switch opens reliably.

6. An electrical machine, comprising an electronic power circuit according to claim 1, an electrical consumer, which is supplied with the pulsed electrical voltage by means of the electronic power circuit, and a control apparatus which is equipped to open and close the first semiconductor switch in accordance with the pulse pattern by means of actuation.

7. The electrical machine according to claim 6, whose control apparatus is equipped to alternately open and close the first semiconductor switch during operation in accordance with the pulse pattern and to leave the second semiconductor switch closed, and to alternately open and close the first semiconductor switch in accordance with the pulse pattern during test operation and to open and again close the second semiconductor switch at a time in which at least one power semiconductor switch is opened, before the power semiconductor is supposed to close again.

8. The electrical machine according to claim 7, whose control apparatus is equipped to evaluate the electrical signal applied at the second semiconductor switch during test operation in order to verify whether the second semiconductor switch opens reliably.

9. The electrical machine according to claim 6, whose control apparatus is equipped to keep the second semiconductor switch opened during an initialization of the electronic power circuit.

10. A method for testing the electronic power circuit according to claim 1, the method comprising:
   alternatingly opening and closing the first semiconductor switch in accordance with the pulse pattern, and
   opening the second semiconductor switch at a time when the at least one power semiconductor switch is opened, and again closing the second semiconductor switch before the power semiconductor switch is supposed to close again.

11. The method according to claim 10, further comprising evaluating the electrical signal at the time of the opened second semiconductor switch applied on said second semiconductor switch in order to verify whether the second semiconductor switch opens reliably.

* * * * *